United States Patent [19]

Sundaresan

[11] Patent Number: 5,346,839
[45] Date of Patent: Sep. 13, 1994

[54] SIDEWALL DOPING TECHNIQUE FOR SOI TRANSISTORS

[75] Inventor: Ravishankar Sundaresan, Garland, Tex.

[73] Assignee: Texas Instruments Incorporated, Dallas, Tex.

[21] Appl. No.: 1,875

[22] Filed: Jan. 8, 1993

Related U.S. Application Data

[63] Continuation of Ser. No. 712,381, Jun. 10, 1991, Pat. No. 5,292,670.

[51] Int. Cl.$^5$ ............... H01L 21/265; H01L 21/302; H01L 21/76
[52] U.S. Cl. ........................... 437/21; 437/40; 437/62
[58] Field of Search ............ 437/21, 40, 901, 938, 437/141; 148/DIG. 77, DIG. 150; 257/347

[56] References Cited

U.S. PATENT DOCUMENTS

| | | | |
|---|---|---|---|
| 4,675,978 | 6/1987 | Swartz | 29/571 |
| 4,753,896 | 6/1988 | Matloubian | 437/29 |
| 4,879,254 | 11/1989 | Tsuzuki et al. | 437/228 |
| 4,963,502 | 10/1990 | Teng et al. | 437/228 |
| 4,978,626 | 12/1990 | Poon et al. | 437/44 |
| 5,053,345 | 10/1991 | Schnable et al. | 437/21 |

FOREIGN PATENT DOCUMENTS 0240781 10/1987 Fed. Rep. of Germany ........ 437/44

OTHER PUBLICATIONS

Ghandhi, Sorab K., *VLSI Fabrication Principles—Silicon and Gallium Arsenide*, 1983, pp. 524–526.

Primary Examiner—George Fourson
Assistant Examiner—Richard A. Booth
Attorney, Agent, or Firm—James C. Kesterson; Rebecca A. Mapstone; Richard L. Donaldson

[57] ABSTRACT

A method of sidewall doping is described wherein the implantation of the dopant is done after the high temperature sidewall oxidation formation. Therefore, this method allows high concentrations of the dopant to be retained along the sidewall thus decreasing the corner coupling.

8 Claims, 2 Drawing Sheets

SIDEWALL DOPING TECHNIQUE FOR SOI TRANSISTORS

This invention was made with Government support under contract No. DNA 001-86-C-0090 awarded by the Defense Nuclear Agency. The Government has certain rights in this invention.

This is a continuation, of application Ser. No. 07/712,381, filed Jun. 10, 1991, now U.S. Pat. No. 5,292,670.

(C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to a sidewall doping technique for use in SOI transistors.

BACKGROUND OF THE INVENTION

A common problem in silicon on insulator (SOI) devices is passivation of the sidewalls. Since the sidewalls are not <100> silicon, they will often have an inherently somewhat lower threshold voltage than the plane in which the primary active devices are constructed, and thus passivation of the sidewalls is particularly difficult.

Moreover, silicon on insulator circuits are particularly attractive for radiation-hard circuit applications which must be extremely resistant to single event upset. Under total dose irradiation, the fixed charge density of the dielectric interface does not stay at the as-manufactured level, and therefore it is particularly desirable that the parasitic transistors along the sidewalls of the mesa be very far from inversion, i.e. very far away from their threshold voltages.

Heavier channel stop doping on the sidewalls of the mesas would obviously help to accomplish this, but to date, there has been no fully satisfactory way to achieve this. Since the sidewall regions are nearly vertical, they are difficult to dope with implantation steps. Moreover, there has been heretofore no convenient self-aligned sequence of steps to leave the sidewall regions exposed.

The most popular way to form the sidewall channel stops has been to introduce a heavy doping, patterned by the mesa mask, and drive that dopant to achieve a substantial lateral diffusion before the mesa etch is performed. However, this has the disadvantage of requiring long furnace times early in the process, and also results in a device where the threshold voltage of the parasitic sidewall transistors in the finished device is critically dependent on the time and temperature of this furnace step. Moreover, due to the concentration gradient implied by the diffusion equations, such lateral diffusion techniques will always produce a net concentration in the sidewalls of the mesa which is lower than the original maximum net concentration in the silicon between mesas.

Doping of the mesa sidewalls is an important step in the SIMOX (Separation by Implantation of Oxygen) fabrication process. It is essential that the dopant concentration is high to achieve good radiation hardness. Presently, as shown in U.S. Pat. No. 4,753,896 assigned to the same corporation, sidewall doping is done prior to the high temperature (1000° C.) sidewall oxidation which drives out the boron from the edges. This tends to cause coupling along edges during radiation causing higher leakage current.

SUMMARY OF THE INVENTION

Thus, the present invention provides major advantages in device characteristics. That is, the present invention provides silicon on insulator IGFET (Insulated Gate Field Effect Transistor) integrated circuit devices which, for a given effective channel length and dielectric composition, are substantially more resistant to turn on of the parasitic sidewall device than devices made by previously known methods.

The present invention also provides silicon on insulator IGFET integrated circuit devices which can remain functional even when the fixed charge density of the dielectric interface increases greatly from the as-manufactured level.

The present invention also provides silicon on insulator IGFET integrated circuit devices which can remain functional after withstanding a substantially higher total dose of ionizing radiation than silicon on insulator IGFET integrated circuit devices of the prior art.

A further advantage of the present invention is that leakage current can be significantly reduced. That is, since the threshold voltage of the parasitic transistor is substantially increased, this parasitic device in its normal state will be farther away from its threshold voltage, and therefore its subthreshold current will be less.

Thus, the present invention provides integrated circuits with substantially improved radiation hardness.

The present invention also advantageously provides integrated circuits with substantially improved radiation hardness at no sacrifice in density.

The advantage of reduced leakage currents is particularly important in CMOS integrated circuits. Thus, the present invention is especially advantageous for CMOS silicon on insulator and CMOS silicon on sapphire integrated circuits.

Thus, the present invention provides silicon on insulator IGFET integrated circuit devices which, for a given channel length and dielectric composition, have substantially lower leakage current (and hence lower power consumption) than will devices made by previously known methods.

In particular, the present invention provides CMOS silicon on insulator IGFET integrated circuit devices which have substantially lower leakage current (and hence lower average power consumption) than comparable prior art devices under conditions where the fixed charge density of the dielectric interface increases greatly from the as-manufactured level.

The present invention also provides silicon on insulator IGFET integrated circuit devices which have substantially lower leakage current (and hence lower average power consumption) than comparable prior art devices after withstanding a substantially high total dose of ionizing radiations.

In particular, the present invention provides CMOS silicon on insulator integrated circuits which have substantially lower leakage current (and hence lower average power consumption) than comparable prior art devices after withstanding a substantially high total dose of ionizing radiation.

The present invention can also be adapted for use with semiconductor materials other than silicon. In particular, the present invention can also be applied to semiconductors closely related to silicon, such as Si(x)Ge(1−x), or Si/Si(x)Ge(1−x) grade-composition structures, or Si/Si(x)C(1-–) graded-composition structures, or Si/Si(x)C(1−x)/Si(x)Ge(1−x) graded composition structures. The present invention can also be applied to self-aligned isolation implantation in Group III-V devices, for example an InGaAs compound. Particularly in Group III-V semiconductors with relatively small bandgaps (e.g. 1.5 ev or less), implantation of dopants to avoid inversion at a dielectric interface (with consequent turn-on of a parasitic device) may be useful. Alternatively, in many Group III-V devices unannealed implantation damage is used for isolation (due to the effects of lattice damage), and the present invention may also be used to provide a narrow region of isolation of this type next to the edge of a mesa or trench.

The present invention can also be adapted to avoid sidewall leakage and inversion problems in semiconductor on insulator integrated circuits using other types of active devices, such as bipolar, MOSFET or MESFET transistors, or others: the advantages of the present invention are generally applicable.

According to the present invention there is provided: A semiconductor-on-insulator device fabricated by the steps of: providing a substrate having at a surface thereof a layer of monocrystalline semiconductor material overlying a layer of an insulator; depositing an oxide layer; providing a patterned masking layer, comprised of a first and a second masking material,, over the oxide layer, the masking layer being patterned to cover predetermined portions of the semiconductor layer where active devices are to be formed; etching the patterned masking layer down to the oxide layer; depositing additional the second masking material, which forms sidewall spacers on the patterned masking layer, so that the patterned masking layer with the spacers covers a larger fraction of the semiconductor layer than was covered by the masking layer alone, but does not cover all of the semiconductor layer; etching away at least some portions of the monocrystalline semiconductor material, using the patterned masking layer and the spacers as a mask, forming a mesa; forming sidewall insulation filaments on the monocrystalline semiconductor material, so that the monocrystalline semiconductor layer with the filaments covers a larger fraction of the semiconductor layer than was covered by the masking layer alone, but does not cover all of semiconductor layer; removing all but the first masking material layer of the patterned masking layers; implanting a dopant substantially into at least some of the portions of the semiconductor material which are not covered by the first masking material layer; removing the first masking material layer, and; fabricating active devices in the mesas.

An advantage of the invention is that the sidewall doping can be performed after the high temperature oxide is grown.

BRIEF DESCRIPTION OF THE DRAWINGS

In the drawings:

FIG. 1 is a cross-sectional view of an SOI structure post deposition of a stress oxide layer and patterned layers of masking materials and etchant.

FIG. 2 is a subsequent cross-sectional view of an SOI structure post formation of masking material sidewalls.

FIG. 3 is a subsequent cross-sectional view of an SOI structure post formation of the mesa.

FIG. 4 is a subsequent cross-sectional view of an SOI structure post sidewall oxide formation.

FIG. 5 is a subsequent cross-sectional view of an SOI structure post removal of the second masking material and implantation of the dopant.

FIG. 6 is a subsequent cross-sectional view of an SOI structure post removal of the first masking material prior to implantation of the active regions of the device.

Corresponding numerals and symbols in the different figures refer to corresponding parts unless otherwise indicated,

DETAILED DESCRIPTION OF PREFERRED EMBODIMENTS

Figure 1:
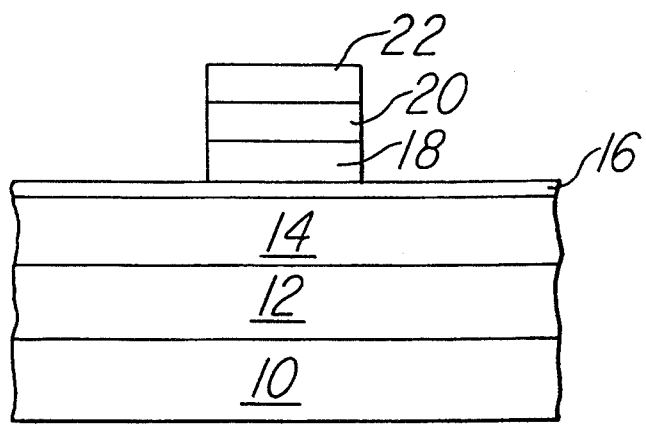
FIGS. 1–6 are sequential views of the resulting structure after each process step described in the preferred embodiment.

The making and use of the presently preferred embodiments will now be discussed in detail. However, it should be appreciated that the present invention provides widely applicable inventive concepts, which can be embodied in numerous specific contexts; the specific embodiments discussed are merely illustrative of specific ways to make and use the invention, and do not delimit the scope of the invention.

Referring now to FIGS. 1 through 6, transistor 100 constructed according to the preferred embodiment is illustrated. The starting material is silicon-on-insulator material, having about 3400 Å of monocrystalline silicon 14 over a buried layer 12 consisting of essentially silicon dioxide (buried layer 12 may include a minor excess of silicon or very minor silicon inclusions), which is supported by an underlying silicon substrate 10. The surface layer 14 can be e.g., n-type <100>.(a square-lattice matrix) having 3–6 ohm-cm (provided by a dopant concentration of about 5E15 cm-3). Alternatively, the substrate 10 and surface layer 14 can be p-type (e.g. 10–12 ohm-cm), to take advantage of the depletion region created under buried layer 12 to reduce parasitic capacitance and lateral breakdown at the oxide interface.

An oxide/polysilicon/nitride hardmask will now be made into a patterned masking layer 24 which covers the active device areas.

Figure 2:
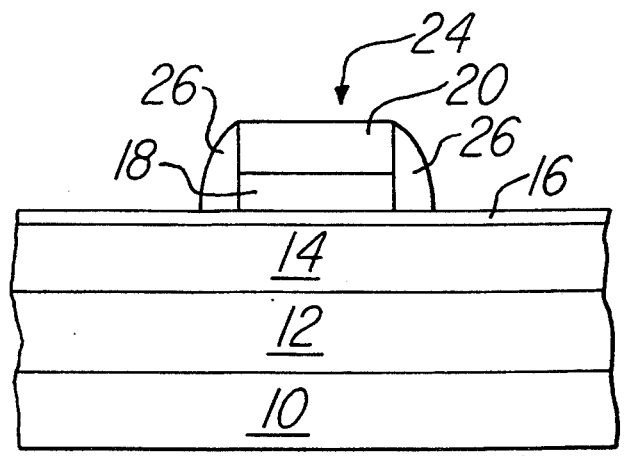
Figure 3:
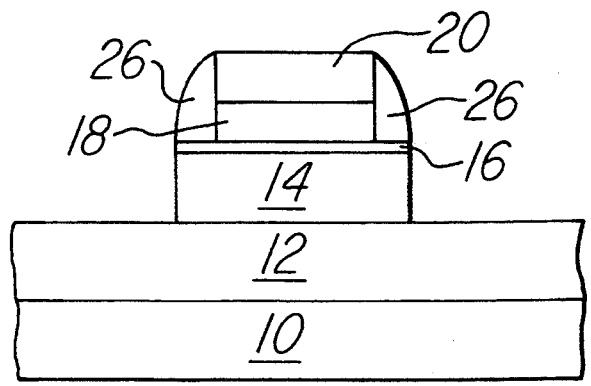
Figure 4:
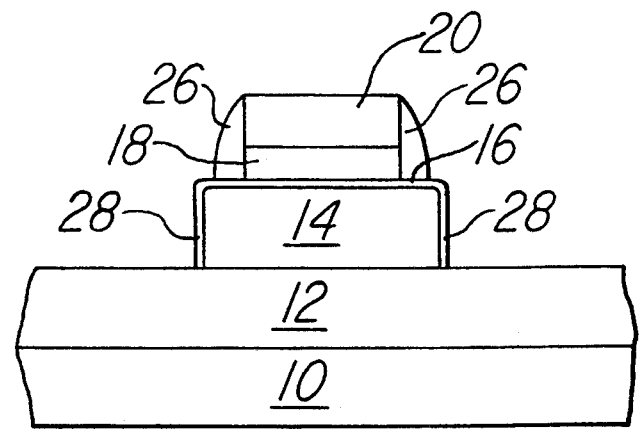
Figure 5:
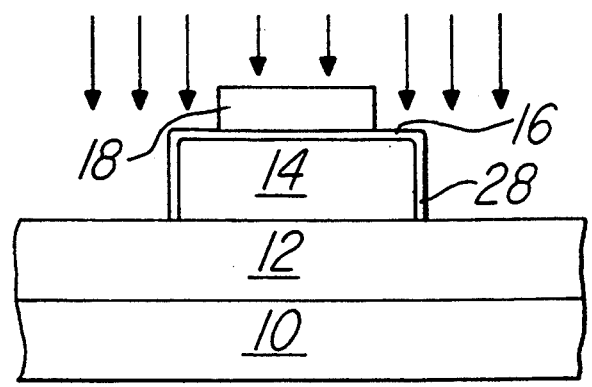
Figure 6:
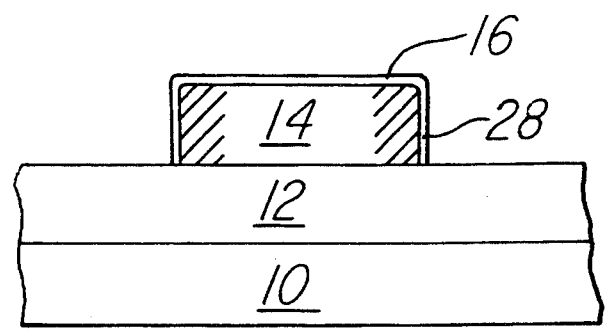

In this example, 350 Å of stress relief pad oxide 16 is grown, covering the monocrystalline silicon 14, 3200 Å of poly-silicon 18 is then deposited by LPCVD, followed by a deposition of 1700 Å of Si3N4 20. Resist 22 is then patterned to cover the moats, i.e. the regions where the active devices are to be formed, and a plasma etch is used to etch through the polysilicon/nitride stack 18, 20 down to the initial oxide layer 16 in accordance with the resist pattern. This produces the structure of FIG. 1, in which the polysilicon/nitride layers 18, 20 have been etched to form the patterned masking layer 24, which has nearly vertical sidewalls. The resist 22 is then stripped. Next, another 1000 Å thick, Si3N4 layer is deposited and etched to form spacers 26, which extend the mesa as shown in FIG. 2. The pad oxide layer 16 and the monocrystalline silicon mesa 14 is then etched using a reactive ion etch (RIE) with Si3N4 20, 26 acting as a mask as shown in FIG. 3. The sidewall oxide 28 is then grown at 1000° C. as shown in FIG. 4, subsequently followed by a nitride strip, using, for example, hot phosphoric acid. The resultant device is shown in FIG. 5. With the polysilicon layer 18 still masking the active regions of the device, boron is next implanted into the mesa edges as shown in FIG. 5. Note that the polysilicon 18 prevents the channel regions from getting doped. The polysilicon 18 can then be removed using a wet or dry etch as shown in FIG. 6. The device that results from this sequence of process steps has a high concentration of sidewall channel stop dopant located almost exactly where the dopant was implanted as shown in FIG. 6. This process allows more boron to be retained along the sidewall thus decreasing the corner coupling. The fabrication process beyond this point is similar to the present baseline process.

A preferred embodiment has been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process for fabricating a semiconductor-on-insulator integrated circuit structure, comprising the steps of:
    providing a substrate having at a surface thereof a monocrystalline semiconductor material layer overlying an insulator layer;
    depositing an oxide layer, covering said monocrystalline semiconductor layer;
    providing a pattered masking layer over said oxide layer, comprising a first and a second masking material layer, said masking layer being patterned to cover predetermined portions of said monocrystalline semiconductor layer where active devices are to be formed;
    depositing additional said second masking material, which forms sidewall spacers on said patterned masking layer, so that said patterned masking layer with said spacers covers a larger fraction of said semiconductor layer than was covered by said masking layer alone;
    etching away at least some portions of said monocrystalline semiconductor material layer, using said patterned masking layer and said spacers as a mask, forming a mesa;
    forming sidewall insulation filaments on said monocrystalline semiconductor material mesa, subsequent to said etching away at least some portions of said monocrystalline semiconductor material, so that said monocrystalline semiconductor layer mesa with said filaments covers a larger fraction of said semiconductor layer than was covered by said masking layer alone;
    removing all but said first masking material layer of the patterned masking layers,;
    implanting a dopant into at least some of the portions of said semiconductor material which are not covered by said first masking material layer to form doped mesa edges, subsequent to said forming of the sidewall insulation filaments and subsequent to said removing all but aid first masking layer step;
    removing said first masking material layer, and;
    fabricating active devices in said mesas.

2. The process of claim 1, wherein said removing said first masking layer step is performed with at least one of a wet and dry etch.

3. The process of claim 1, wherein said removing all but said first masking material layer of the patterned masking layers step is performed with hot phosphoric acid.

4. The process of claim 1, wherein said etching away at least some portions of said monocrystalline semiconductor material step is performed with a RIE.

5. The process of claim 1, wherein said dopant is boron.

6. The process of claim 1, wherein said monocrystalline semiconductor material is silicon.

7. The process of claim 1, wherein first masking material layer is polysilicon.

8. The process of claim 1, wherein said second masking material layer is $Si_3N_4$.

* * * * *